(12) United States Patent
Yu et al.

(10) Patent No.: US 9,772,670 B2
(45) Date of Patent: Sep. 26, 2017

(54) POWER-CONTROL DEVICES

(71) Applicant: VIA Alliance Semiconductor Co., Ltd., Shanghai (CN)

(72) Inventors: Rilong Yu, Shanghai (CN); Yu Zhou, Shanghai (CN)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 14/873,577

(22) Filed: Oct. 2, 2015

(65) Prior Publication Data
US 2017/0060221 A1 Mar. 2, 2017

(30) Foreign Application Priority Data

Sep. 2, 2015 (CN) .......................... 2015 1 0557148

(51) Int. Cl.
*G06F 1/00* (2006.01)
*G06F 1/32* (2006.01)
(Continued)

(52) U.S. Cl.
CPC .......... *G06F 1/3206* (2013.01); *G01K 13/00* (2013.01); *G06F 1/3296* (2013.01); *H02M 3/04* (2013.01); *H03L 1/022* (2013.01); *Y02B 60/1285* (2013.01)

(58) Field of Classification Search
CPC ..... G06F 1/3206; G06F 1/3296; G01K 13/00; H02M 3/04; H03L 1/022; Y02B 60/1285
USPC ......... 365/194; 713/300, 320, 322; 700/299, 700/300; 375/224; 714/704; 327/158, 327/277, 141
See application file for complete search history.

(56) References Cited

U.S. PATENT DOCUMENTS 6,924,679 B2 8/2005 Seno et al.
8,046,601 B1 10/2011 Paz et al.
(Continued)

FOREIGN PATENT DOCUMENTS

JP 2002-100967 4/2002
JP 2013-513898 4/2013
WO WO 2014/088843 6/2014

OTHER PUBLICATIONS

European Search Report dated Nov. 11, 2016, issued in application No. 15189158.7-1959.
(Continued)

*Primary Examiner* — Aurel Prifti
(74) *Attorney, Agent, or Firm* — McClure, Qualey & Rodack, LLP (57) ABSTRACT

A power-control device for generating and controlling a supply voltage is provided. The power-control device includes a variant delay chain with a delay length, a sampling circuit, a comparison circuit, and a power manager. The variant delay chain receives an initial signal and performs a delay operation on the initial signal according to the delay length to generate a delay signal. The sampling circuit receives the delay signal and performs a sampling operation on the delay signal to generate a sampled signal. The comparison circuit receives the sampled signal and compares the sampled signal with a reference signal to generate a comparison result signal. The power manager receives the comparison result signal and adjusts the supply voltage according to the comparison result signal.

10 Claims, 5 Drawing Sheets

(51) Int. Cl.
    *H03L 1/02*   (2006.01)
    *G01K 13/00*  (2006.01)
    *H02M 3/04*   (2006.01)

(56) References Cited

U.S. PATENT DOCUMENTS

| | | | | |
|---|---|---|---|---|
| 8,098,085 | B2* | 1/2012 | Wang | G04F 10/005 |
| | | | | 327/8 |
| 8,378,738 | B1 | 2/2013 | Zhu et al. | |
| 8,643,416 | B2* | 2/2014 | Fujimaki | H03L 7/0814 |
| | | | | 327/158 |
| 8,874,978 | B2* | 10/2014 | Hirairi | G06F 11/1008 |
| | | | | 714/704 |
| 2004/0017234 | A1* | 1/2004 | Tam | G06F 1/08 |
| | | | | 327/141 |
| 2004/0239395 | A1* | 12/2004 | Nakai | G06F 1/3203 |
| | | | | 327/277 |
| 2008/0191789 | A1 | 8/2008 | Anidjar et al. | |
| 2010/0095137 | A1* | 4/2010 | Bieswanger | G06F 1/3203 |
| | | | | 713/300 |
| 2011/0145605 | A1 | 6/2011 | Sur et al. | |
| 2011/0169563 | A1 | 7/2011 | Bhaumik et al. | |
| 2012/0023382 | A1 | 1/2012 | Sandhu et al. | |
| 2012/0254676 | A1* | 10/2012 | Hirairi | G06F 11/1008 |
| | | | | 714/704 |
| 2013/0121094 | A1* | 5/2013 | Zerbe | H03L 7/091 |
| | | | | 365/194 |
| 2013/0246820 | A1* | 9/2013 | Branover | G06F 1/3296 |
| | | | | 713/320 |
| 2013/0311801 | A1* | 11/2013 | Kong | G06F 1/26 |
| | | | | 713/320 |
| 2013/0343441 | A1* | 12/2013 | Alfieri | H04L 7/02 |
| | | | | 375/224 |
| 2014/0032949 | A1* | 1/2014 | Kim | G06F 1/3206 |
| | | | | 713/322 |
| 2014/0062553 | A1* | 3/2014 | Shim | H03L 7/08 |
| | | | | 327/158 |
| 2014/0132245 | A1 | 5/2014 | Dally et al. | |
| 2014/0163765 | A1* | 6/2014 | Jain | G06F 1/206 |
| | | | | 700/300 |
| 2014/0201851 | A1 | 7/2014 | Guo et al. | |
| 2014/0236380 | A1* | 8/2014 | Alton | G06F 1/206 |
| | | | | 700/299 |
| 2015/0287444 | A1* | 10/2015 | Lee | G11C 7/08 |
| | | | | 713/322 |
| 2015/0346798 | A1* | 12/2015 | Dongara | G06F 1/3206 |
| | | | | 713/320 |
| 2016/0147291 | A1* | 5/2016 | Thomas | G06F 1/3296 |
| | | | | 713/320 |

OTHER PUBLICATIONS

Anonymous; "Back to Basics: Power Management Impacts All Electronic Systems;" XP055314315A; Jan. 1, 2010; pp. 1-8.

* cited by examiner

POWER-CONTROL DEVICES

CROSS REFERENCE TO RELATED APPLICATIONS

This Application claims priority of China Patent Application No. 201510557148.X, filed on Sep. 2, 2015, the entirety of which is incorporated by reference herein.

BACKGROUND OF THE INVENTION

Field of the Invention

The invention relates to a power-control device, and more particularly to a power-control device with a performance monitor circuit which is capable of generating a supply voltage to a target processing module to serve as its operation voltage by monitoring the operation state of the target processing module.

Description of the Related Art

Electronic devices consume power when processors perform operations, and so power control is important, especially in mobile devices. When a processor in performs a specific operation, a lower supply voltage is expected, for reducing power consumption. Generally, one dynamic voltage-frequency scaling (DVFS) table consists of a plurality of operation frequencies and a plurality of corresponding operation voltages. For a batch of chips, an operation voltage applied to the batch of chips can be found in one DVFS table on a specific operation frequency. However, among one batch of chips, the chips may have different frequency-voltage characteristics, and even the frequency-voltage characteristic of one chip can vary between different operation states. Thus, when a fixed DVFS table is applied for all of the chips in the same batch, power consumption may not be reduced for the chips that can achieve the same expected operation frequency on lower voltages.

BRIEF SUMMARY OF THE INVENTION

An exemplary embodiment is provided of a power-control device for generating and controlling a supply voltage. The power-control device comprises a variant delay chain with a delay length, a sampling circuit, a comparison circuit, and a power manager. The variant delay chain receives an initial signal and performs a delay operation on the initial signal according to the delay length to generate a delay signal. The sampling circuit receives the delay signal and performs a sampling operation on the delay signal to generate a sampled signal. The comparison circuit receives the sampled signal and compares the sampled signal with a reference signal to generate a comparison result signal. The power manager receives the comparison result signal and adjusts the supply voltage according to the comparison result signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
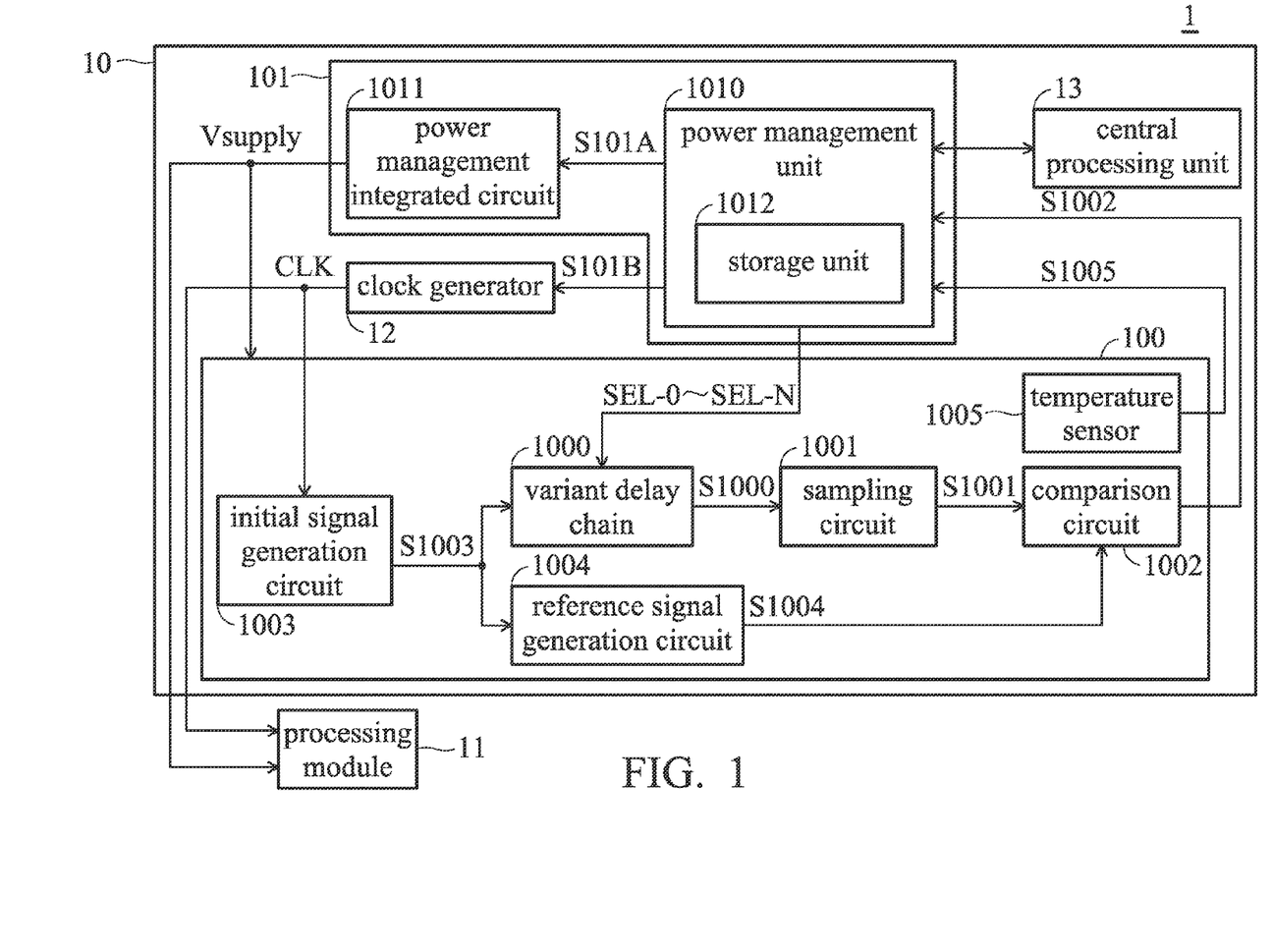
FIG. 1 shows one exemplary embodiment of an electronic system.

FIG. 1 shows an exemplary embodiment of an electronic system. An electronic system 1 shown in FIG. 1 can be a mobile device, such as a smartphone, a tablet PC, or a digital camera. Referring to FIG. 1, the electronic system 1 comprises a power-control device 10, a processing module 11, a clock generator 12, and a central processing unit (CPU) 13. The power-control device 10 comprises a performance monitor 100 and a power manager 101. The performance monitor 100 comprises a variant delay chain 1000, a sampling circuit 1001, a comparison circuit 1002, an initial signal generation circuit 1003, a reference signal generation circuit 1004, and a temperature sensor 1005. The power manager 101 comprises a power management unit (PMU) 1010 and a power management integrated circuit (PMIC) 1011. In the embodiment of FIG. 1, the power management integrated circuit 1011 and the power management unit 1010 are two separate components or devices, and the power management integrated circuit 1011 is controlled by the power management unit 1010. In other embodiments, the power management integrated circuit 1011 is embodied in the power management unit 1010. That is, the power management integrated circuit 1011 is one portion of the power management unit 1010. In these embodiments, the power management unit 1010 serves as the power manager 101.

The power management unit 1010 comprises a storage unit 1012 which stores a dynamic voltage-frequency scaling (DVFS) table. The DVFS consists of a plurality of operation frequencies and a plurality of corresponding operation voltages. While the electronic system 1 operates initially, the central processing unit 13 controls the power management unit 1010 to initially select an expected operation frequency and the corresponding operation voltage from the DVFS table according to the expected performance of the processing module 11. The power management unit 1010 generates control signals S101A and S101B to the power management integrated circuit 1011 and the clock generator 12 according to the selected operation frequency and the selected operation voltage, respectively. The power management integrated circuit 1011 initially generates a supply voltage Vsupply with a predetermined level (the predetermined level corresponds to the operation voltage selected by the power management unit 1010) according to the control signal S101A. The clock generator 12 generates a clock signal CLK according to the control signal S101B. In the embodiment, the clock generator 12 is implemented by a phase-locked loop structure.

The processing module 11 receives the supply voltage Vsupply to serve as its operation voltage and further receives the clock signal CLK to serve as a clock base of operations. The performance monitor 100 receives the supply voltage Vsupply to serve as its operation voltage and further receives the clock signal CLK. In other words, the processing module 11 and the performance monitor 100 share the supply voltage Vsupply and the clock signal CLK. The performance monitor 100 operates to monitor the operation performance of the processing module 11, and the monitoring result is applied to control the power manager 101 to adjust or not adjust the supply voltage Vsupply. In the following description, the monitoring operation of the performance monitor 100 will be illustrated. In the performance monitor 100, the initial signal generation circuit 1003 receives the clock signal CLK and generates an initial signal S1003 according to the clock signal CLK. The variant delay chain 1000 receives the initial signal S1003 and performs a delay operation on the initial signal S1003 by using the current delay length to generate a delay signal S1000. In the embodiment, the variant delay chain 1000 is used to imitate a critical path of the processing module 11, and the delay length of the variant delay chain 1000 corresponds to the timing of the critical path. Accordingly, the performance monitor 1000 can determine the critical path of the processing module 11 and the timing of the critical path through the variant delay chain 1000. In the embodiment, the variant delay chain 1000 just delays the timing of the initial signal S1003 to generate the delay signal S1000, and, however, the variant delay chain 1000 does not invert the initial signal S1003 for output. That is, the level variation of the delay signal S1000 is the same as that of the initial signal S1003. The sampling circuit 1001 receives the delay signal S1000 and performs a sampling operation on the delay signal S1000 to generate a sampled signal S1001. The reference signal generation circuit 1004 also receives the initial signal S1003 and performs a sampling operation on the initial signal S1003 according to the clock signal CLK to generate a reference signal S1004.

The comparison circuit 1002 receives the sampled signal S1001 output from the sampling circuit 1001 and the reference signal S1004 output from the reference signal generation circuit 1004. The comparison circuit 1002 compares the sampled signal S1001 and the reference signal S1004 and generates a comparison result signal S1002 according to the comparison result. The comparison result signal S1002 is transmitted to the power management unit 1010. In cases where the comparison circuit 1002 determines that the sampled signal S1001 is the same as the reference signal S1004 through the comparison operation, the variant delay chain 1000 operates normally. Since the variant delay chain 1000 imitates the critical path of the processing module 11, in cases where the comparison circuit 1002 determines that the sampled signal S1001 is the same as the reference signal S1004 through the comparison operation, the processing module 11 can operate normally on the current operation voltage (that is, the current supply voltage Vsupply). In such cases, according to the comparison result signal S1002, the power management unit 1010 determines that the currently generated supply voltage Vsupply is sufficient for the processing module 11 to operate normally. Thus, the power management unit 1010 controls the power management integrated circuit 1011 to lower the supply voltage Vsupply (that is, to lower the voltage level). On the other hand, in cases where the comparison circuit 1002 determines that the sampled signal S1001 is different from the reference signal S1004 through the comparison operation, the variant delay chain 1000 does not operate normally, and the processing module 11 cannot operate normally on the current operation voltage (that is, the current supply voltage Vsupply). In such cases, according to the comparison result signal S1002, the power management unit 1010 determines that the currently generated supply voltage Vsupply is not sufficient for the processing module 11 to operate normally. Thus, the power management unit 1010 controls the power management integrated circuit 1011 not to adjust the supply voltage Vsupply (that is, not to adjust the voltage level), so as not to lower the level of the supply voltage Vsupply. In other words, when the power management unit 1010 determines that continuously lowering the supply voltage Vsupply is not adequate for the processing module 11 to operate normally, the supply voltage is maintained at the current level or pulled slightly high.

According to the description above, after the power manager 101 initially generates the supply voltage Vsupply with the initial level based on the DVFS table, the power-control device 10 imitates the critical path of the processing module 11 through the variant delay chain 1000 in the performance monitor 100, thereby monitoring the operation performance when the processing module 11 is operating on the current operation voltage and dynamically adjusting the supply voltage Vsupply in response to the monitoring result. When the performance monitor 100 determines that the processing module 11 can operate normally on the current operation voltage, the power manager 101 lowers the supply voltage Vsupply provided to the processing module 11, which can reduce the power consumption of the processing module 11. Moreover, according to the embodiment, even if one DVFS table is applied for all of the chips in the same batch, each chip can operate on the operation voltage which better conforms to the frequency-voltage characteristic through the voltage adjustment of the power-control device 10. Thus, better performance and low power consumption can be achieved.

Figure 2:
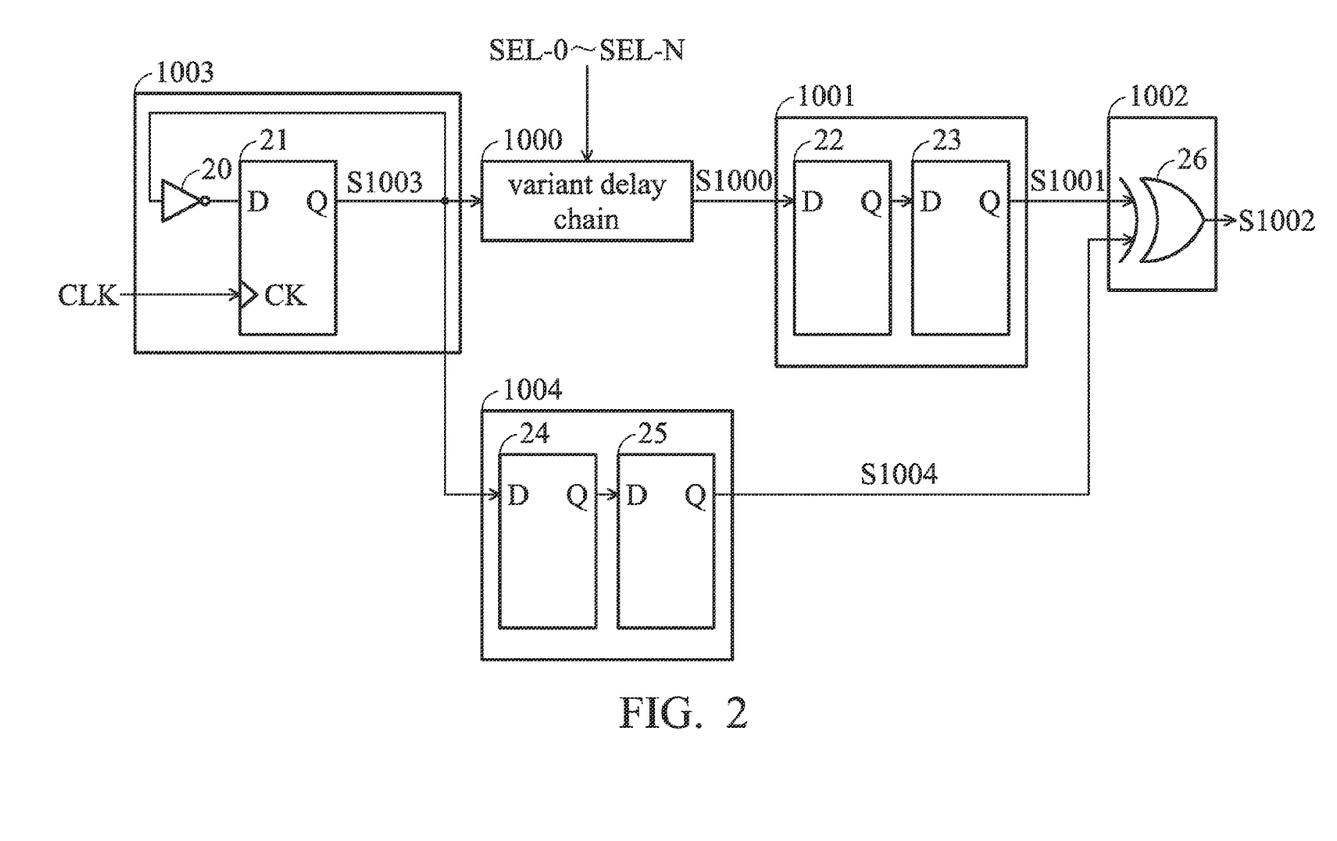
FIG. 2 shows an exemplary embodiment of a performance monitor.

FIG. 2 shows an exemplary embodiment of the performance monitor 100. Referring to FIG. 2, the initial signal generation circuit 1003 comprises an inverter 20 and a flip-flop 21. An input terminal of the inverter 20 is coupled to an output terminal Q of the flip-flop 21, and an output terminal thereof is coupled to an input terminal D of the flip-flop 21. The flip-flop 21 generates the initial signal S1003 at the output terminal Q. The variant delay chain 1000 receives the initial signal S1003 and generates the delay signals S1000. The sampling circuit 1001 comprises flip-flops 22 and 23. An input terminal D of the flip-flop 22 receives the delay signal S1000. An input terminal D of the flip-flop 23 is coupled to an output terminal Q of the flip-flop 22. The sampling circuit 1001 performs the sampling operation on the delay signal S1000 through the operations of the flip-flops 22 and 23 to generate the sampled signal S1001 at an output terminal Q of the flip-flop 23. The reference signal generation circuit 1004 comprises flip-flops 24 and 25. An input terminal D of the flip-flop 24 receives the initial signal S1003. An input terminal D of the flip-flop 25 is coupled to an output terminal Q of the flip-flop 24. The reference signal generation circuit 1004 performs the sampling operation on the initial signal S1003 through the operations of the flip-flops 24 and 25 to generate the reference signal S1004 at an output terminal Q of the flip-flop 24. The comparison circuit 1002 comprises an XOR gate 26. Two input terminals of the XOR gate 26 receive the sampled signal S1001 and the reference signal S1004 respectively. When the sampled signal S1001 is the same as the reference signal S1004, the XOR gate 26 generates the comparison result signal S1002 with a low level. At this time, the power management unit 1010 controls the power management integrated circuit 1011 to lower the supply voltage Vsupply according to the comparison result signal with the low level. When the sampled signal S1001 is different from the reference signal S1004, the XOR gate 26 generates the comparison result signal S1002 with a high level. At this time, the power management unit 1010 controls the power management integrated circuit 1011 not to adjust the supply voltage Vsupply according to the comparison result signal with the high level, so as not to lower the level of the supply voltage Vsupply.

Figure 3:
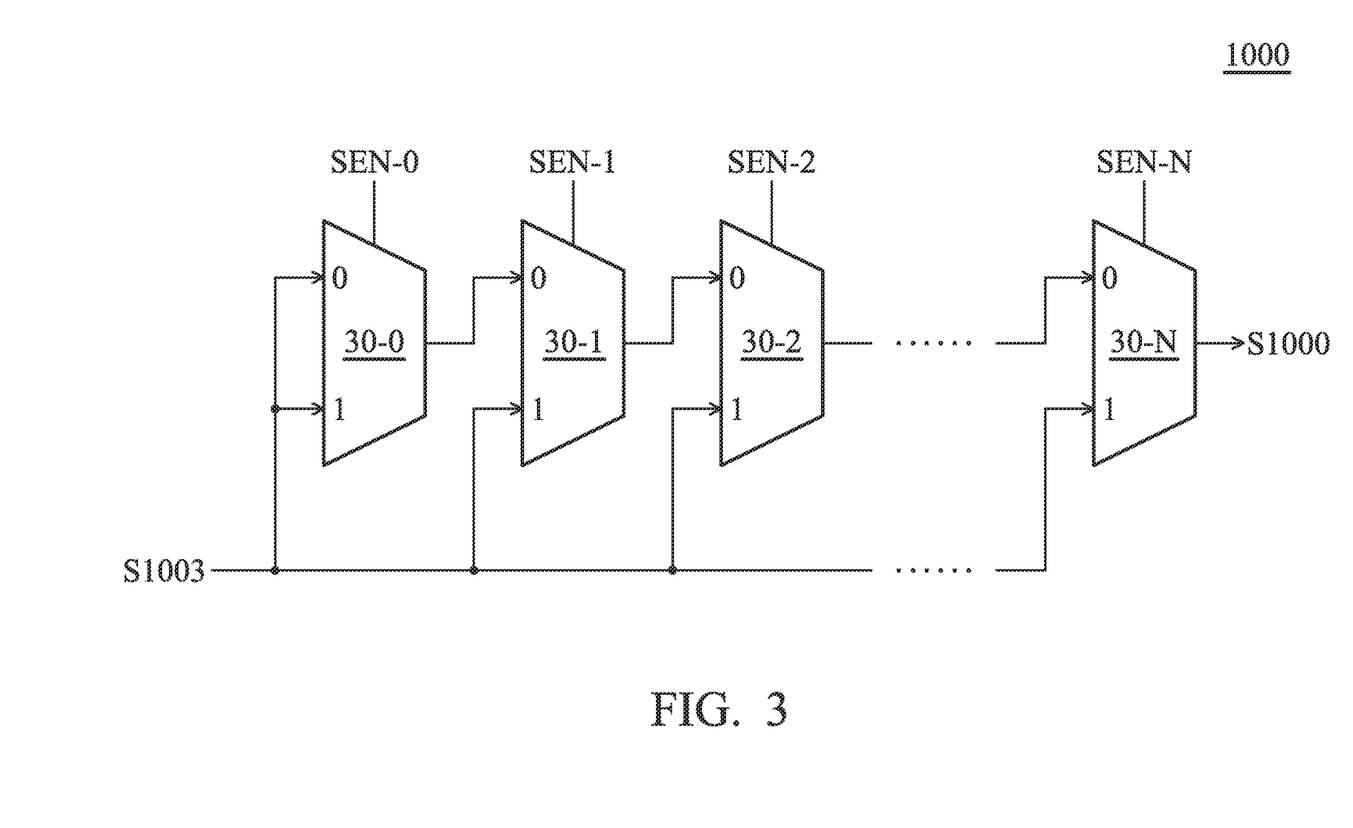
FIG. 3 shows an exemplary embodiment of variant delay chain.

FIG. 3 shows an exemplary embodiment of the variant delay chain 1000. As shown in FIG. 3, the variant delay chain 1000 comprises a plurality of multiplexers 30-0~30-N coupled in series. Except the multiplexer 30-0, one terminal (0) of each one among the multiplexers 30-1~30-N is coupled to the output of the previous multiplexer, and the other input terminal thereof (1) receives the initial signal S1003. The two input terminals of the multiplexer 30-0 both receive the initial signal S1003. The output terminal of the multiplexer 30-N generates the delay signal S1000. In the embodiment, the delay length of the variant delay chain 1000 is adjustable. Referring to FIGS. 1 and 3, the variant delay chain 1000 is controlled by the power management unit 1010. The power management unit 1010 generates a plurality of selection signals SEL-1~SEL-N to the variant delay chain 1000 to control the multiplexers 30-0~30-N, respectively. The power management unit 1010 adjusts or changes the delay length of the variant delay chain 1000 through the selection signal SEL-0~SEL-N.

In the embodiments in FIGS. 2 and 3, the structures of the variant delay chain 1000, the sampling circuit 1001, the comparison circuit 1002, the initial signal generation circuit 1003, and the reference signal generation circuit 1004 are used as an example. In practice, the above circuits may have different structures according to the system requirements and specifications.

Referring to FIG. 1, in an embodiment, the delay length of the variant delay chain 1000 can be adjusted or changed according to the ambient temperature of the power-control device 10 (that is, the ambient temperature of the processing module 11). In the following paragraphs, the operation of adjusting the delay length of the variant delay chain 1000 according to the ambient temperature will be described by referring to FIGS. 1 and 4. The temperature sensor 1005 of the performance monitor 100 senses the ambient temperature of the temperature sensor 1005 to generate a temperature signal S1005 (step S40). The temperature sensor 1005 generates the temperature signal S1005 according to the sensed ambient temperature and provides the temperature signal S1005 to the power management unit 1010. The power management unit 1010 determines the ambient temperature according to the temperature signal S1005 (step S41). The power management unit 1010 determines whether the sensed ambient temperature reaches an upper threshold (step S42). When the power management unit 1010 determines that the sensed ambient temperature reaches the upper threshold, the power management unit 1010 issues an interrupt signal to the central processing unit 13. At this time, the central processing unit 13 transmits an instruction signal to the power management unit 1010 in response to the interrupt signal, so that the power management unit 1010 controls the power management integrated circuit 1011 to lower the supply voltage Vsupply (step S43), thereby preventing the chip of the processing module 11 from being damaged. In another embodiment of step S43, when the power management unit 1010 determines that the sensed ambient temperature reaches the upper threshold, the power management unit 1010 directly controls the power management integrated circuit 1011 to lower the supply voltage Vsupply. In such cases, the power management unit 1010 does not issue an interrupt signal to the central processing unit 13.

Figure 4:
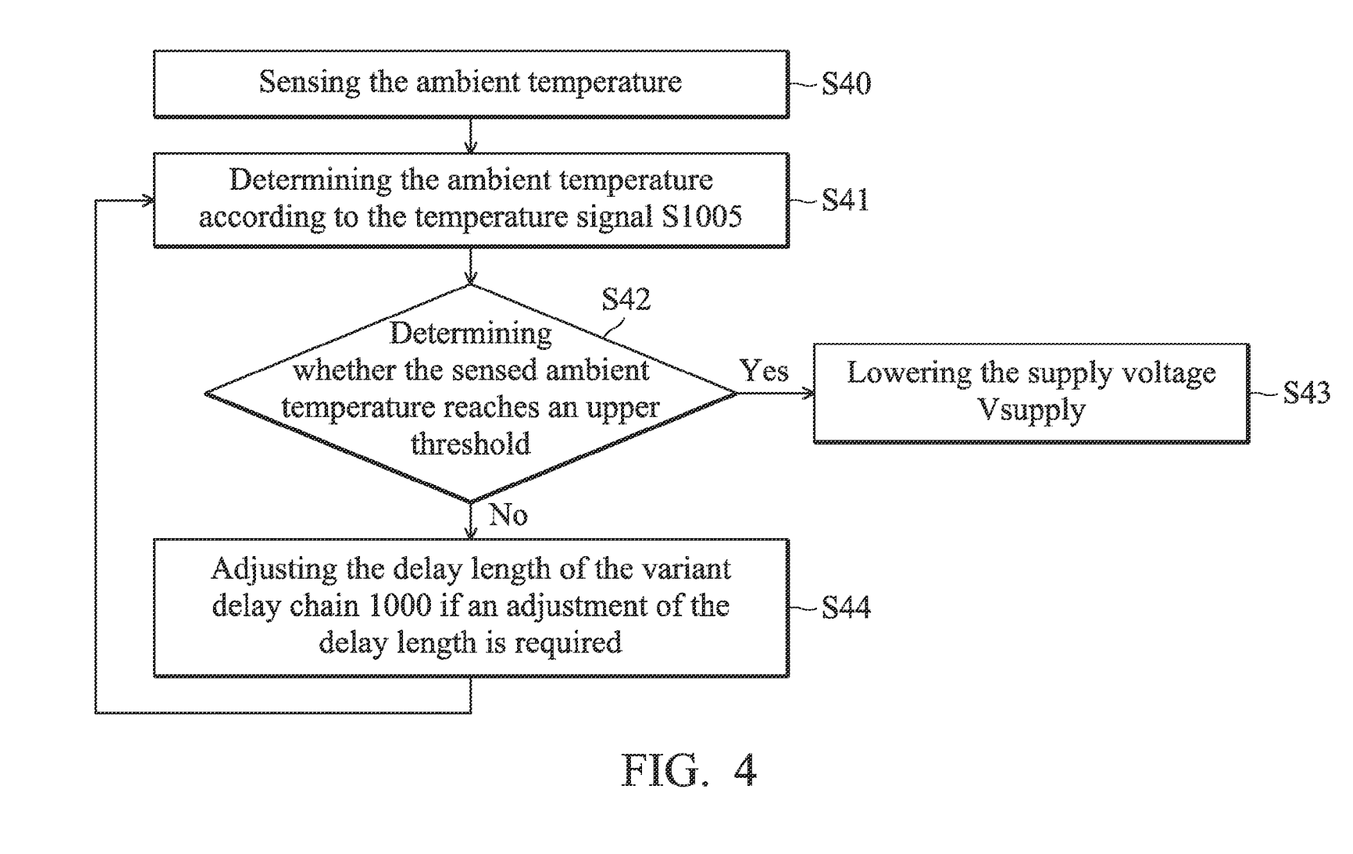
FIG. 4 is a flow chart of an exemplary embodiment of a method for adjusting a delay length of a variant delay chain.

When the power management unit 1010 determines that the sensed ambient temperature has not reached the upper threshold yet, the power management unit 1010 issues an interrupt signal to the central processing unit 13. At this time, the central processing unit 13 transmits an instruction signal to the power management unit 1010 according to the previous and current operation states of the processing module 11, so that the power management unit 1010 can adjust the delay length of the variant delay chain 1000 if an adjustment of the delay length is required (step S44). According to the description above, the power management unit 1010 adjusts the delay length of the variant delay chain 1000 through the selection signals SEL-0~SEL-N. In another embodiment of the step S44, when the power management unit 1010 determines that the sensed ambient temperature has not yet reached the upper threshold, the power management unit 1010 directly adjusts the delay length of the variant delay chain 1000 through the selection signals SEL-0~SEL-N. In such cases, the power management unit 1010 does not issue an interrupt signal to the central processing unit 13.

Figure 5:
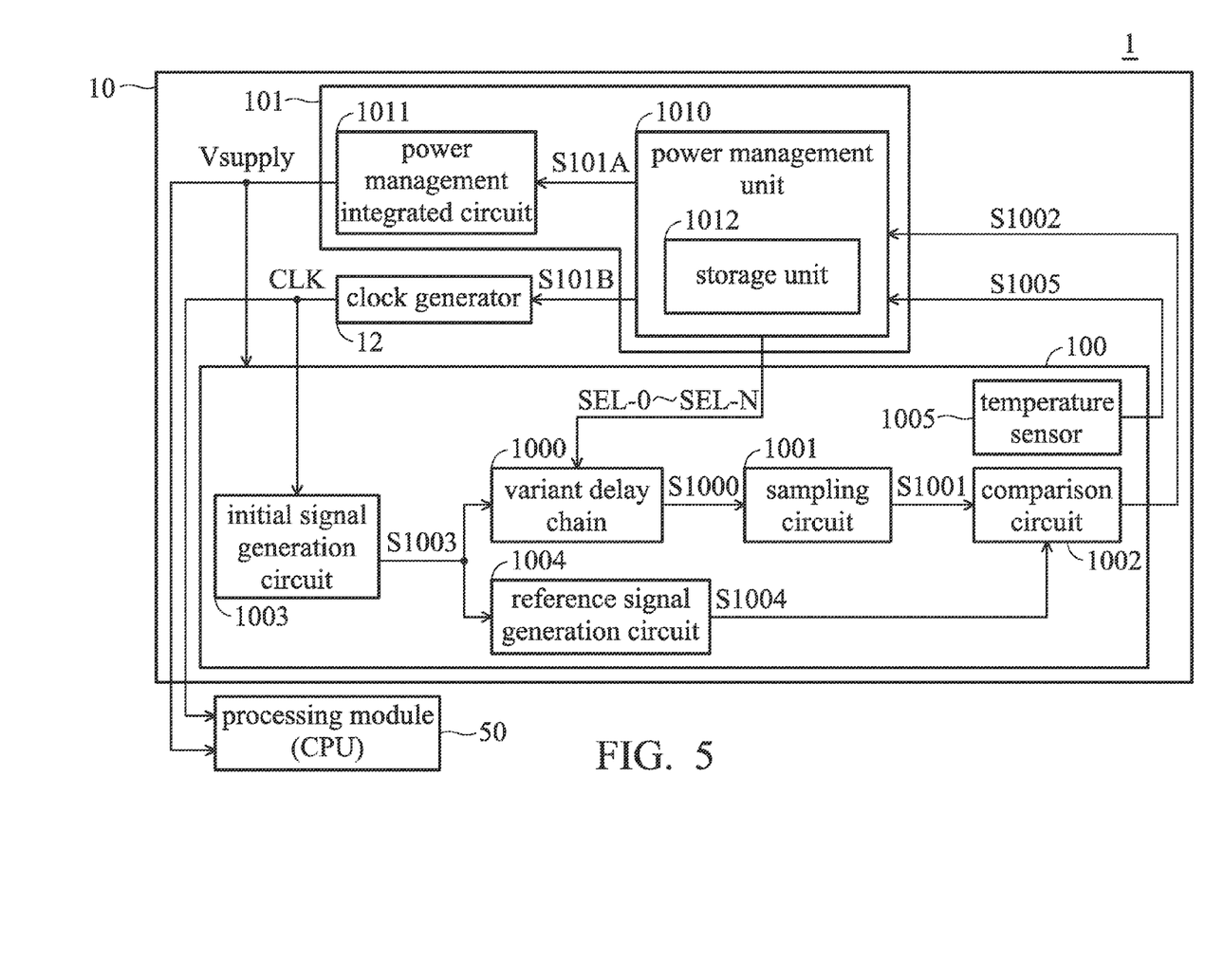
FIG. 5 shows another exemplary embodiment of an electronic system.

In the above embodiments, the processing module 11 monitored by the performance monitor 100 can be a graphics processing unit (GPU), a micro-controller, or a dedicated controller. In some embodiments, as shown in FIG. 5, the processing module 50 monitored by the performance monitor 100 can be a central processing unit. In embodiment of FIG. 5, the central processing unit 13 may be excluded. In the steps S43 and 44 of the embodiment of FIG. 4, the power management unit 1010 issues an interrupt signal to the processing module 50, and the processing module 50 transmits an instruction signal to the power management unit 1010 in response to the interrupt signal. That is, in the embodiment of FIG. 5, the operations performed by the central processing unit 13 shown in the embodiment of FIG. 1 are performed by the processing module 50.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A power-control device for generating and controlling a supply voltage, comprising:
   a variant delay chain with a delay length, receiving an initial signal and performing a delay operation to the intial signal according to the delay length to generate a delay signal;
   a sampling circuit receiving the delay signal and performing a sampling operation to the delay signal to generate a sampled signal;
   a reference signal generation circuit receiving the initial signal and generating a reference signal by sampling the initial signal according to the clock signal;
   a comparison circuit receiving the sampled signal and comparing the sampled signal with the refernce signal to generate a comparison result signal; and
   a power manager receiving the comparison result signal and adjusting the supply voltage according to the comparison result signal, wherein the power manager generates the supply voltage to a processing module to serve as an operation voltage, and the variant delay chain imitates timing of a critical path of the processing module through the delay length.

2. The power-control device as claimed in claim 1, wherein when the comparison circuit determines that the sampled signal is the same as the reference signal, the power manager lowers a level of the supply voltage according to the comparison signal.

3. The power-control device as claimed in claim 1, wherein when the comparison circuit determines that the sampled signal is different from the reference signal, the power manager does not adjust the level of the supply voltage according to the comparison signal.

4. The power-control device as claimed in claim 1, further comprising:
   a temperature sensor sensing an ambient temperature of the temperature sensor and generating a temperature signal according to the sensed ambient temperature,
   wherein the power manager determines whether the ambient temperature reaches an upper threshold according to the temperature signal, and
   wherein when the power manager determines that the ambient temperature does not reach the upper threshold according to the temperature signal, the power manager can adjust the delay length of the variant delay chain.

5. The power-control device as claimed in claim 4, wherein when the power manager determines that the ambient temperature reaches the upper threshold according to the temperature signal, the power manager lowers the level of the supply voltage.

6. The power-control device as claimed in claim 1, further comprising:
   an initial signal generation circuit generating the initial signal according to a clock signal.

7. The power-control device as claimed in claim 1, wherein the power manager comprises:
   a power management integrated circuit generating the supply voltage; and
   a power management unit receives the comparison result signal and controlling the power management integrated circuit according to the comparison result signal to adjust the supply voltage.

8. A power-control device as claimed in claim 1, wherein the processing module is a central processing unit, graphics processing unit (GPU), and micro-controller, or a dedicated cotroller.

9. The power-control device as claimed in claim 1, wherein the power manager initially generates the supply voltage with an initial level according to an operation frequency and then adjusts a level of the supply voltage.

10. The power-control device as claimed in claim 1, wherein the power manager generates the supply voltage to a processing module to serve as an operation voltage, and a predetermined level of the operation voltage corresponds to an expected operation frequency of the processing module.

* * * * *